United States Patent [19]
Washburn et al.

[11] Patent Number: 6,081,440
[45] Date of Patent: Jun. 27, 2000

[54] TERNARY CONTENT ADDRESSABLE MEMORY (CAM) HAVING FAST INSERTION AND DELETION OF DATA VALUES

[75] Inventors: James G. Washburn, Palo Alto; Jayan Ramankutty; Ajit K. Medhekar, both of San Jose, all of Calif.

[73] Assignee: Lara Technology, Inc., San Jose, Calif.

[21] Appl. No.: 09/186,562

[22] Filed: Nov. 5, 1998

[51] Int. Cl.$^7$ .................................................. G11C 15/00
[52] U.S. Cl. ................ 365/49; 365/189.05; 365/189.07; 711/108
[58] Field of Search ............................... 365/49, 189.05, 365/189.07, 230.08; 711/108

[56] References Cited

U.S. PATENT DOCUMENTS

| | | |
|---|---|---|
| 3,675,211 | 7/1972 | Raviv . |
| 4,065,756 | 12/1977 | Panigrahi .................................. 365/49 |
| 4,791,606 | 12/1988 | Threewitt et al. . |
| 4,845,668 | 7/1989 | Sano et al. . |
| 4,928,260 | 5/1990 | Chuang et al. . |
| 4,975,873 | 12/1990 | Nakabayashi et al. . |
| 5,014,195 | 5/1991 | Farrell et al. . |
| 5,383,146 | 1/1995 | Threewitt . |
| 5,440,715 | 8/1995 | Wyland .................................. 395/435 |
| 5,706,224 | 1/1998 | Srinivasan et al. ........................ 365/49 |

OTHER PUBLICATIONS

McAuley, A. and Francis, P., "Fast Routing Table Lookup Using CAMs," *Proceedings IEEE INFOCOM*, 1993, pp. 1382–1391.

Gupta et al., "Routing Lookups in Hardware at Memory Access Speeds," *Proceedings of the IEEE INFOCOM*, 1998.

*Primary Examiner*—Richard Elms
*Assistant Examiner*—Hien Nguyen
*Attorney, Agent, or Firm*—Bradley T. Sako

[57] ABSTRACT

A ternary content addressable memory (CAM) (800) having a massive, parallel shift capability is disclosed. The CAM (800) includes an array of CAM cells (802(1,1) to 802(1,4)), each of which includes a data value register (804(1,1) to 804(1,4)) and a mask value register (806(1,1) to 806(1,4)). To enable parallel shifting between a CAM cell in one row with a corresponding CAM cell in a higher row, each data value register (804(1,1) 804(1,4)) and mask value register (806(1,1) to 806(1,4)) includes an upper data input (UD) coupled the output of a CAM cell in the higher row. To enable parallel shifting between a CAM cell in one row with a corresponding CAM cell in a lower row, each data value register (804(1,1) 804(1,4)) and mask value register (806(1, 1) to 806(1,4)) includes a lower data input (LD) coupled the output of a CAM cell in the lower row.

20 Claims, 6 Drawing Sheets

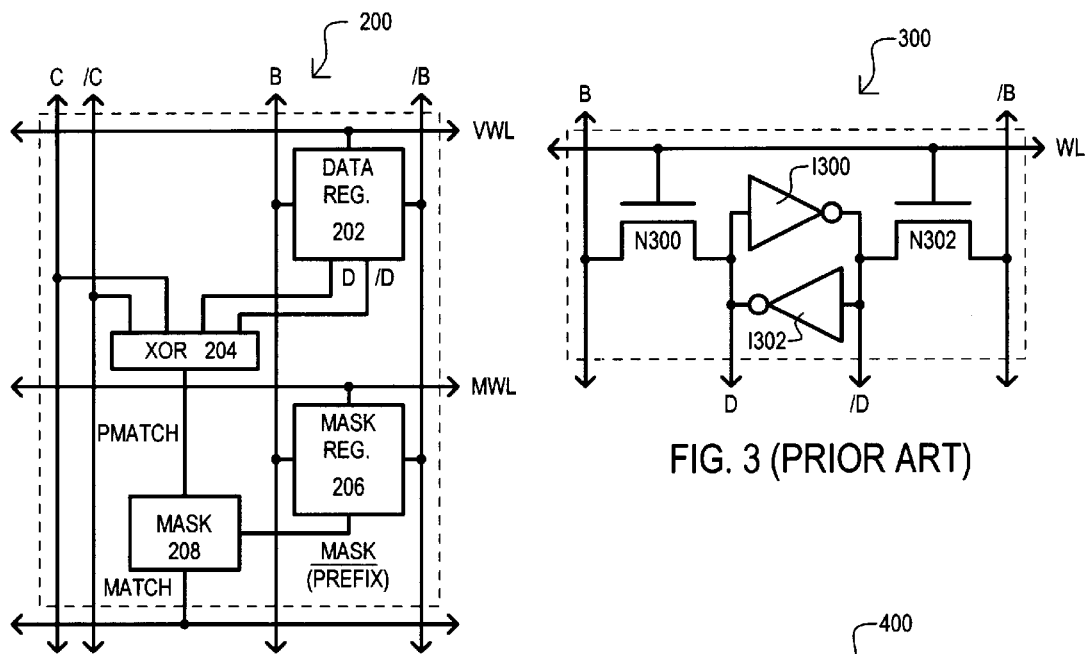
FIG. 1 (PRIOR ART)
FIG. 2 (PRIOR ART)
FIG. 3 (PRIOR ART)
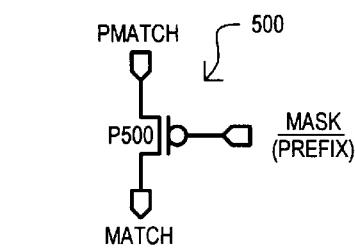
FIG. 5 (PRIOR ART)
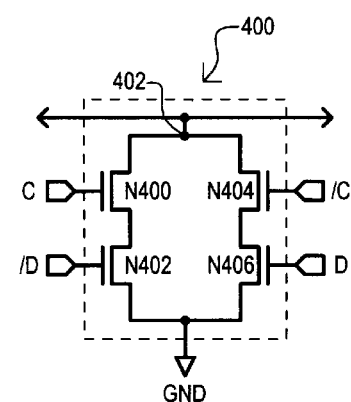
FIG. 4 (PRIOR ART)

|  NEW VALUE | VALUE | PREFIX(MASK) |
|---|---|---|
|  | Z3 Z2 Z1 Z0 | 1 0 0 0 |

| LOCATION | VALUE | PREFIX(MASK) |
|---|---|---|
| 0 | A3 A2 A1 A0 | 1 1 1 1 |
| 1 | B3 B2 B1 B0 | 1 1 1 0 |
| 2 | C3 C2 C1 C0 | 1 1 0 0 |
| 3 | D3 D2 D1 D0 | 1 0 0 0 | ← PREFIX MATCH |
| 4 | E3 E2 E1 E0 | 0 0 0 0 |
| 5 | F3 F2 F1 F0 | 0 0 0 0 |
| 6 | G3 G2 G1 G0 | 0 0 0 0 |
| 7 | H3 H2 H1 H0 | 0 0 0 0 |

FIG. 6A

| LOCATION | VALUE | PREFIX(MASK) |
|---|---|---|
| 0 | A3 A2 A1 A0 | 1 1 1 1 |
| 1 | B3 B2 B1 B0 | 1 1 1 0 |
| 2 | C3 C2 C1 C0 | 1 1 0 0 |
| 3 | D3 D2 D1 D0 | 1 0 0 0 |
| 4 | D3 D2 D1 D0 | 1 0 0 0 |
| 5 | E3 E2 E1 E0 | 0 0 0 0 |
| 6 | F3 F2 F1 F0 | 0 0 0 0 |
| 7 | G3 G2 G1 G0 | 0 0 0 0 |
| 8 | H3 H2 H1 H0 | 0 0 0 0 |

FIG. 6B

| LOCATION | VALUE | PREFIX(MASK) |
|---|---|---|
| 0 | A3 A2 A1 A0 | 1 1 1 1 |
| 1 | B3 B2 B1 B0 | 1 1 1 0 |
| 2 | C3 C2 C1 C0 | 1 1 0 0 |
| 3 | Z3 Z2 Z1 Z0 | 1 0 0 0 |
| 4 | D3 D2 D1 D0 | 1 0 0 0 |
| 5 | E3 E2 E1 E0 | 0 0 0 0 |
| 6 | F3 F2 F1 F0 | 0 0 0 0 |
| 7 | G3 G2 G1 G0 | 0 0 0 0 |
| 8 | H3 H2 H1 H0 | 0 0 0 0 |

FIG. 6C

| VALUE TO BE DELETED | VALUE | PREFIX($\overline{\text{MASK}}$) |
|---|---|---|
| | N3 N2 N1 N0 | 1 1 1 0 |

| LOCATION | VALUE | PREFIX($\overline{\text{MASK}}$) |
|---|---|---|
| 0 | L3 L2 L1 L0 | 1 1 1 1 |
| 1 | M3 M2 M1 M0 | 1 1 1 1 |
| 2 | N3 N2 N1 N0 | 1 1 1 0 |
| 3 | O3 O2 O1 O0 | 1 1 0 0 |
| 4 | P3 P2 P1 P0 | 1 1 0 0 |
| 5 | Q3 Q2 Q1 Q0 | 1 0 0 0 |
| 6 | R3 R2 R1 R0 | 1 0 0 0 |
| 7 | S3 S2 S1 S0 | 0 0 0 0 |

MATCH LOCATION → 2

FIG. 7A

| LOCATION | VALUE | PREFIX($\overline{\text{MASK}}$) |
|---|---|---|
| 0 | L3 L2 L1 L0 | 1 1 1 1 |
| 1 | M3 M2 M1 M0 | 1 1 1 1 |
| 2 | O3 O2 O1 O0 | 1 1 0 0 |
| 3 | P3 P2 P1 P0 | 1 1 0 0 |
| 4 | Q3 Q2 Q1 Q0 | 1 0 0 0 |
| 5 | R3 R2 R1 R0 | 1 0 0 0 |
| 6 | S3 S2 S1 S0 | 0 0 0 0 |
| 7 | | |

FIG. 7B

TERNARY CONTENT ADDRESSABLE MEMORY (CAM) HAVING FAST INSERTION AND DELETION OF DATA VALUES

TECHNICAL FIELD

The present invention relates generally to content addressable memories (CAMs) and more particularly to ternary CAMs.

BACKGROUND OF THE INVENTION

Computer networks continue to proliferate. As a result, data traffic among networks continues to rise, placing ever-increasing demands on the ability of network structures to transfer data between source and destination locations. Network data is usually transferred in data units referred to as "packets" (or datagrams) that are transmitted from a source machine and eventually received by a destination machine. While network data transfers may appear transparent to both the source machine and the destination machine, in actuality, the data packets are usually transferred between intermediate stages (referred to as "hops") by machines referred to as "routers." A router will receive a packet, examine destination information within the packet, and from this destination information, "forward" the packet to a "next" hop destination. In this manner, data is forwarded by one or more hops, and eventually arrives at the desired destination. The function of examining a destination address and determining next hop information is often referred to as "address matching."

Routing functions rely on an underlying standardization in the data packet format and transmission method (protocols). One of the most prevalent protocols is the internet protocol (IP). IP serves to route a given packet from a source to a destination. To accomplish this function an IP data packet will include an initial portion (header) that includes, among other information fields, a source address and a destination address. As noted above, it is the destination address that is utilized by a routing machine to transfer a data packet to its next hop or final destination. To accomplish the routing function, a router will typically include a "look-up" table that includes next hop information corresponding to particular destination addresses. The router examines the destination address of an incoming packet, looks up the next hop information, and uses the next hop information to forward the packet onward toward its destination.

Routing functions can be performed by general purpose processors with conventional memory devices that run a routing algorithm. Such an approach can result in limited throughput of data packets, be expensive in terms of component cost, and require considerable area to implement.

An alternate way to address the need for faster routers is to fabricate an integrated circuit that is specialized to perform routing tasks. Such application specific integrated circuits (ASICs), because they are custom manufactured products, can also be expensive to manufacture and implement.

One type of device that is particularly suitable for router address matching functions is a content addressable memory (CAM), also referred to as an "associative memory." A CAM includes a number of data storage locations, each of which can be accessed by a corresponding address. The order in which the data values are stored varies according to the type of CAM. As just one example, in a typical "binary" CAM, data can be stored in the first available "empty" location. Empty locations are distinguished from "full" (or valid) locations by a status bit associated with each storage location.

Once data is stored in a CAM, valid locations can then be addressed according to the contents (data values) that they store. A comparand value is loaded into a comparand register. The value within the comparand register can then be compared to the data values within each valid location. In the event the value within the comparand register matches the value of a storage location, a match signal for the matching storage location will be generated. In the event there is more than one match, one match from the multiple matches will be selected according to predetermined priority criteria. The address corresponding to the match location can then be made available.

Among the various types of CAMs are binary CAMs and ternary CAMs. A binary CAM typically includes a number of CAM cells arranged into rows and columns, with CAM cells of the same row being commonly coupled to a word line, and CAM cells of the same column being commonly coupled to the same bit line (or bit line pair). Each binary CAM cell includes a storage circuit, for storing a data value, and a compare circuit for comparing the stored data value to a comparand value. When the comparand value matches the data value, the binary CAM cell will provide a bit match indication.

As noted above, a binary CAM can provide a rapid look-up function for an IP address. However, this is only true when the look-up function is for IP addresses having the same number of bits. Unfortunately, IP addresses can have prefixes of variable length. To illustrate this point, an example of two variable length prefix addresses is set forth below. The prefix values that must be matched are shown as binary values (either 0 or 1). The remaining portions of the IP address that do not have to be matched, are represented by a series of Xs.

| | |
|---|---|
| 11110000 10XXXXX XXXXXXXX XXXXXXXX | (address 1) |
| 10101010 01010101 100XXXXX XXXXXXXX | (address 2) |

Thus, the first address requires a router to find a match with a 10-bit prefix, while the second address requires a match with a 19-bit prefix. For proper routing of data packets, it is desirable for a router to perform a longest prefix matching function to ensure that the proper next hop information is associated with a data packet.

A prior art way to address longest prefix matching is to utilize a "ternary" or "tertiary" CAM. In a ternary CAM, a data value is stored according to the length of its prefix. This is accomplished by providing a prefix (or inverse mask) bit for each bit of data. An example of a ternary CAM storage arrangement is illustrated by a table set forth in FIG. 1. The table of FIG. 1 describes a ternary CAM having eight locations, each of which can store a data word having a length of four bits. Longest prefix matching is required, thus the ternary CAM is required to compare either all four bits, the first three bits, the first two bits or the first bit of the data words. To indicate which bits comprise a prefix, the ternary CAM includes prefix data corresponding to each bit storage location. If reference is made to FIG. 1, it is shown that data location "0" stores the four-bit data value A3 A2 A1 A0. Corresponding to the data location 0 is the prefix value 1111. This prefix value indicates that all four bits are to be compared with a comparand value. In contrast, data location "5," which stores the four-bit data value F3 F2 F1 F0, has a prefix value of 1100. This prefix value indicates that the first two bits F3 and F2 are to be compared with a comparand value.

A prior art ternary CAM cell is set forth in FIG. 2 and designated by the general reference character 200. The ternary CAM cell 200 includes some of the same circuit constituents as the binary CAM cell described above. Namely, the ternary CAM cell 200 includes a data register 202 and a compare circuit 204. As in the case of the binary CAM cell, the data register 202 serves to store data value and the compare circuit 204 serves to compare the stored data value to an applied comparand value (C and /C). The data register 202 is coupled to a complementary bit line pair (B and /B) by a value word line (VWL). The compare circuit 204 receives the data value stored by the data register 202 and the comparand value (C and /C), and compares the two values to generate a pre-match value (PMATCH).

To accomplish the variable prefix matching function, the ternary CAM cell 200 further includes a mask register 206 and a mask circuit 208. The mask register 206 stores the mask (inverse prefix) value that corresponds to the data value in the data register 202. For example, referring back to FIG. 1, the prefix value corresponding to the G3 value stored in location 6 is "1." The prefix value is the inverse of the mask value, thus, if the data register 202 stores the G3 value, the mask register 206 would store a "0" value (i.e., the entire mask value for the data word at storage location 6 would be 0111, the inverse of the prefix value shown in the table of FIG. 1).

In the prior art arrangement of FIG. 2, the mask register 206 has the same general structure as the data register 202, and a mask value can be written into the mask register 206 by way of the bit line pair (B and /B) by activating a corresponding mask word line MWL. The value stored by the mask register 206 is supplied to the mask circuit 208. The mask circuit 208 provides a match value MATCH having a value that will depend upon the mask value MASK. In the event the MASK value is low (indicating that the stored data bit is a prefix bit—and the results of the compare operation are desired), the PMATCH value is provided as an output by the mask circuit 208 to generate the MATCH value. Conversely, when the MASK value is high (indicating that the stored data bit is not part of the prefix—and the results of the compare operation are to be ignored) the PMATCH value is prevented from being passed through the mask circuit 208.

Referring now to FIG. 3, a prior art register that may be used as the storage register 202 or the mask register 206 is set forth in a block schematic diagram. The register is designated by the general reference character 300 and includes a pair of cross-coupled inverters I300 and I302. The inverters (I300 and I302) are "cross-coupled" in that the output of inverter I300 is coupled to the input of inverter I302, and vice versa. The outputs of the inverters (I300 and I302) provide the data values on lines D and /D. Thus, the node formed at the output of inverter I302 and the input of inverter I300 can be considered a data node. The inverters (I300 and I302) provide the storage function of the register 300, and are accessed by two n-channel pass transistors N300 and N302. Transistor N300 has a source-drain path coupled between bit line B and the input of inverter I300. Transistor N302 has a source-drain path coupled between bit line /B and the input of inverter I302. The gates of transistors N300 and N302 are commonly coupled to a word line WL. In the case of a storage register, the word line would be a value word line (VWL). In the case of a mask register, the word line would be a mask word line (MWL).

FIG. 4 sets forth a prior art compare circuit 400 that may be used as the compare circuit 204 set forth in FIG. 2. The compare circuit is an exclusive OR (XOR) circuit that includes a first pair of n-channel transistors N400 and N402 arranged in series between a match node 402 and a ground voltage GND. The gate of transistor N400 receives a comparand value C. The gate of transistor N402 receives the complementary data value /D. The compare circuit 400 further includes a second pair of transistors N404 and N406 arranged in series between the match node 402 and the GND voltage. The gate of transistor N404 receives a complementary comparand value /C and the gate of transistor N406 receives a data value D. In the event the comparand values (C and /C) are different than the data values (D and /D, respectively), the match node 402 will be discharged to the GND voltage. However, in the event the comparand values (C and /C) are different than the data values (D and /D), the match node 402 will remain at a precharged level, indicating a bit match condition.

Finally, FIG. 5 is a schematic diagram illustrating a mask circuit that may be used as the mask circuit 208 set forth in FIG. 2. The mask circuit 500 is shown to be a p-channel metal-oxide-semiconductor (MOS) transistor P500 having a source-drain path coupled between the PMATCH signal and the MATCH signal. The gate of transistor P500 is driven by the MASK signal. In this arrangement, if the MASK signal is low, the PMATCH signal is provided as the MATCH signal. If the MASK signal is high, transistor P500 is turned off, preventing the PMATCH signal from being transmitted, and thereby "masking" the bit compare operation result.

While the ternary CAM 200 provides for parallel, variable prefix matching, it requires that the data values be loaded into the storage locations in a particular order. As shown in FIG. 1, those data values having the longest prefixes must precede those with shorter prefixes. In this arrangement, as a comparand value is applied, it is first matched against location 0, then location 1, and so on, until all locations have been examined. The priority of the match will be established by the location of the match. Thus, if an applied comparand value generates a match indication for location 1 (i.e., the first four bits of the comparand value match B3 B2 B1 and B0) and generates a match indication for location 3 (i.e., the first three bits of the comparand value match D3 D2 an D1), location 1, due to its location number, will provide the largest prefix match.

The above discussion has assumed that the ternary CAM values remain static. In most applications this is not the case. Routers, for example, consistently update next hop information. This can present a problem to the conventional ternary CAM as it requires that stored data values to be re-ordered when a new data value is added, or an old data value is removed. A conventional update (i.e., re-order) operation for a ternary CAM can be illustrated by referring once again to FIG. 1. If it is assumed that a new data value must be added (Z3 Z2 Z1 Z0), and the value has prefix data equal to "1110," data location 3 must be freed, and those values having a prefix length equal to or less than the new data value will have to be rewritten into a higher number location. That is, data value H3 H2 H1 H0 will have to written into data location 8, G3 G2 G1 G0 will have to written into data location 7, F3 F2 F1 F0 will have to written into data location 6, E3 E2 E1 E0 will have to written into data location 5, and D3 D2 D1 D0 will have to written into data location 3 would then be free, and the Z3 Z2 Z1 Z0 value could be written into that location. It is clear that adding a data value to ternary CAM requires a considerable amount of time, particularly if there are many data values in the ternary CAM.

The deletion of a data value from a conventional ternary CAM can also be time consuming. This aspect can be illustrated once again by referring to FIG. 1. If it is assumed that the data value at data location 1 (B3 B2 B1 B0) is to removed, data location 1 would be overwritten with the C3 C2 C1 C0 value, data location 2 would then be overwritten with the D3 D2 D1 D0 value, data location 3 would be overwritten with the E3 E2 E1 E0 value, and so on, until data location 6 is overwritten with the H3 H2 H1 H0 value. The various read and write functions required to reorder data values in a conventional ternary CAM is typically accomplished by software within the router.

Major routers may need to be updated as much as several hundred times a second. Thus, when CAMs are utilized for the look-up function, a substantial amount of time must be dedicated to simply updating the CAM values. The problem is compounded by the fact that the routing function is a "real-time" process, in which packets can arrive at any time. If the CAM values must be updated, the forwarding function of the router must be temporarily suspended to allow for the update operation (addition or removal of data values) to take place. This often requires the addition of devices that provide a relatively deep buffering function. In this way, routers that utilize ternary CAMs can suffer in performance and incur additional expense due to the update requirements.

It would be desirable to provide some way reducing the time required to add or delete a data value stored in a ternary CAM and yet maintain a predetermined order within the CAM.

SUMMARY OF THE INVENTION

According to the preferred embodiment, a ternary content addressable memory (CAM) is provided that includes a number of storage locations, each of which can store a data value and a corresponding mask value. The data values are ordered within the ternary CAM according to their corresponding mask value characteristics. The ternary CAM is capable of performing a conventional search function, in which matches are found between an applied comparand value and match portions within the data values. In addition, the ternary CAM is also capable of executing a novel "ordered insert" and a novel "ordered delete" function.

In an ordered insert function, the ternary CAM will take a new data value and mask value, and determine where it should be placed within the CAM data value order. The CAM data values within the desired location, and those values below the desired location, are shifted in parallel downward, thereby freeing up the desired CAM location. The new data and mask values are then written into the (now) free location. It is noted that the ordered insert function does not require a number of discrete read and write functions to accomplish the parallel shift function. Instead, specialized CAM cells are provided for this function that result in a massive, parallel shift of data and corresponding mask values from one row to an adjacent row.

The preferred embodiment ordered delete function also relies on the parallel shift function. In the ordered delete function, a ternary CAM location is deleted, and the CAM data values below the deleted location are shifted upward in order.

To accomplish the novel upward and downward shifting function, the preferred embodiment ternary CAM includes CAM cells having specialized register circuits for storing both a data value and its corresponding mask value. Each register circuit includes an input multiplexer and a first storage register. In a standard function, the input multiplexer couples bit line values to the storage register. In a shift operation, the multiplexer couples either downward shifted input data (data from a previous location in the CAM order), or upward shifted input data (data from a subsequent location in the CAM order). Each register circuit further includes a second storage register for providing a stored value as input data for a CAM cell in the previous location or the subsequent location.

According to one aspect of the preferred embodiment, the CAM cells are formed using complementary transistors.

According to another aspect of the preferred embodiment, in addition to being capable of performing a compare operation on a stored data value, the CAM cells of the preferred embodiment are further capable of providing a comparison on stored mask values.

According to another aspect of the preferred embodiment CAM cells, each cell is capable of shifting data in two directions within a CAM cell array to neighboring cells.

BRIEF DESCRIPTION OF THE DRAWINGS

FIG. 1 is a table illustrating a prior art ternary content addressable memory (CAM).

FIG. 2 is a block schematic diagram of a prior art ternary CAM cell.

FIG. 3 is a detailed schematic diagram of a prior art register circuit.

FIG. 4 is a detailed schematic diagram of a prior art compare circuit.

FIG. 5 is a detailed schematic diagram of a prior art mask circuit.

FIGS. 6A–6C are tables illustrating an ordered insert operation in a ternary CAM according to the preferred embodiment.

FIGS. 7A and 7B are tables illustrating an ordered delete operation in a ternary CAM according to the preferred embodiment.

DETAILED DESCRIPTION OF THE EMBODIMENTS

Figure 8:
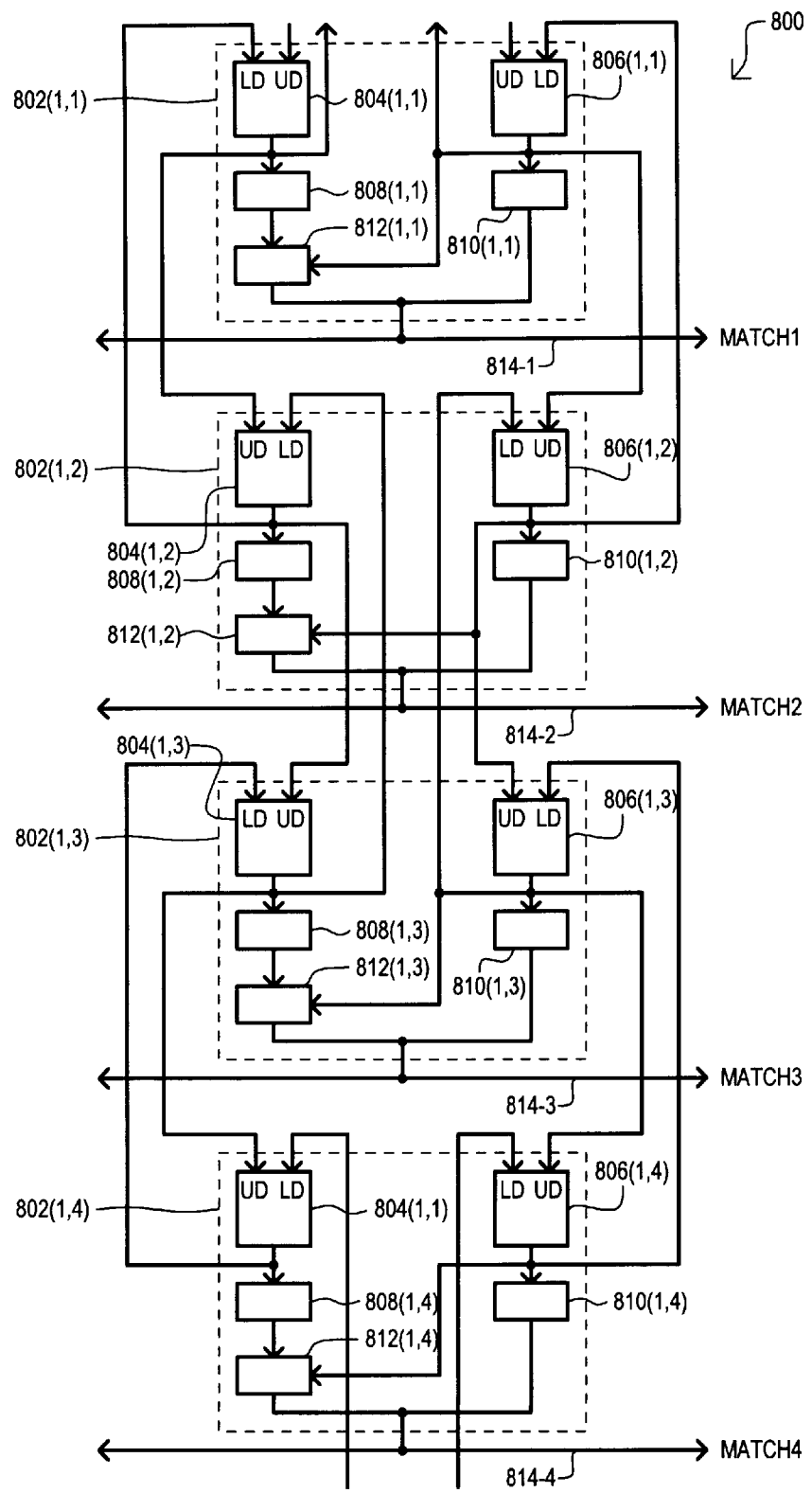
FIG. 8 is a simplified block schematic diagram illustrating the general structure of a CAM according to the preferred embodiment.

The preferred embodiment is a ternary content addressable memory (CAM) having a plurality of CAM cells arranged into rows and columns. Data values are stored within the rows of the ternary CAM in a predetermined order. The preferred embodiment ternary CAM is capable of shifting sections of the array (including the entire array) in a downward direction (with respect to the predetermined order) to free up a given location within the CAM. This enables a data value to be inserted into the CAM without disturbing the order of the remaining data values. In a similar fashion, the preferred embodiment is capable of shifting sections of the array (including the entire array) in an upward direction (with respect to the predetermined order) to thereby overwrite, and hence delete one data value without disturbing the overall order of the remaining data values. The preferred embodiment will first be described in a series of tables to illustrate the various novel functions it is capable of performing. The structure of one particular embodiment will then be described by a series of schematic diagrams.

Referring now to FIGS. 6A–6C, three tables are set forth to generally illustrate an "ordered insert" operation of one particular embodiment. FIG. 6A is a table that illustrates an example of data values and prefix (inverse mask) values for a given ternary CAM. The table includes a LOCATION column which indicates eight locations, numbered 0–7, within the ternary CAM. In the particular example of FIG. 6A, each location stores a four-bit data value. The various corresponding data values are shown in a VALUE column, and labeled A3 A2 A1 A0 to H3 H2 H1 H0. A third column, shown as PREFIX sets forth a four-bit prefix value for each data value. It is understood that the CAM could store the prefix values as mask values. In such a case, the mask value would be the logical inverse of the prefix value (e.g., location 0 would have a mask value of "0000" while location 4 would have a mask value of "1111"). In the preferred embodiment example, the prefix values indicate which portions of the data values are compare portions (i.e., should be compared with a comparand value) and determine the particular order of the data values. Thus, because the prefix value for the first data location (location 0) is "1111," it represents the largest possible prefix value, as all four bits of the corresponding data value (A3 A2 A1 A0) are to be compared to a comparand value. The next location stores the data value/prefix value having the next largest prefix value. This is repeated throughout the ternary CAM.

FIG. 6A also sets forth an incoming data value/prefix value combination that is to be loaded into the ternary CAM. The new value is shown to have a four-bit data value given as Z3 Z2 Z1 Z0 and a corresponding prefix value of "1000."

In an ordered insert operation according to the preferred embodiment, the ternary CAM will first search the stored prefix values for the lowest entry within the ternary CAM that includes a prefix value which matches that of the incoming value. In the particular example of FIG. 6A, location 3 is the lowest entry with a matching prefix value, and so is indicated with an arrow in the figure.

Once the lowest matching CAM entry is determined, the ternary CAM will perform a "shift down" operation on all CAM entries having locations with values that are greater than or equal to the lowest matching CAM entry. Because location 3 was the matching CAM entry locations 3–7 are shifted downward, to locations 4–8, respectively. The ternary CAM following the shift down operation is set forth in FIG. 6B. In the preferred embodiment, the "emptied" location (location 3) will still retain its previous value, but this not necessary for the ordered insert operation.

Following the shift down operation, the incoming value is written into the emptied location. In the preferred embodiment this will involve overwriting the previous value. The ternary CAM following the writing of the incoming value is set forth in FIG. 6C. Location 3 now stores the data value Z3 Z2 Z1 Z0 and its corresponding prefix 1000. As shown by the figure, the correct order of data values is maintained.

It is understood that the shift down operation is a massive, parallel shift operation that provides for shifting of data values (and their corresponding prefix values) from one location to the next in an essentially simultaneous fashion. This is in sharp contrast to conventional approaches that can require numerous read and/or write operations to the ternary CAM.

Referring now to FIGS. 7A and 7B, two tables are set forth to generally illustrate an "ordered delete" operation of one particular embodiment. FIG. 7A is a table that illustrates an example of data values and mask values for a given ternary CAM. The table, like that of FIG. 6A, includes a LOCATION column, a VALUE column, and a PREFIX column. Also, like the ternary CAM arrangement of FIG. 6A, the four-bit prefix values determines the particular order of the data values.

In the ordered delete operation, the values stored at one location within the ternary CAM must be deleted, and the then remaining values reordered. In the particular example of FIGS. 7A and 7B, it is the data/prefix value combination N3 N2 N1 N0/1110 that must be deleted. The data values and prefix values are searched until their corresponding location is determined. This is represented in FIG. 7A by an arrow, which indicates that location 2 includes the data/prefix combination that is to be deleted.

Once the matching CAM entry (location 2) is determined, the ternary CAM will perform a "shift up" operation on all CAM entries having locations with values that are greater than the matching CAM entry. Because location 2 was the matching CAM entry locations 3–7 are shifted upward to locations 2–6, respectively. The ternary CAM following the shift up operation is set forth in FIG. 7B. In the preferred embodiment, the location (location 3) that contained the data to be deleted is overwritten with the data from the subsequent location (location 4).

Like the shift down operation utilized in the ordered insert operation, the shift up operation is a massive, parallel shift operation that provides for shifting of data values (and their corresponding prefix values) from one location to the previous location in an essentially simultaneous fashion. Again, this is in sharp contrast to conventional approaches that can require numerous read and/or write operations.

Referring now to FIG. 8, the preferred embodiment CAM is illustrated by a simplified block schematic diagram. The preferred embodiment is designated by the general reference character 800 and sets forth a portion of an array of CAM cells. The particular portion set forth illustrates four CAM cells of the same column. The CAM cells are identified by the reference character "802" and include two subsequent numbers, set within parentheses, that indicate the position of the CAM cell within the array. The first position identifying number indicates the particular column of the CAM cell while the second position identifying number indicates the particular row of the CAM cells. The CAM cells are thus identified as 802(1,1), 802(1,2), 802(1,3) and 802(1,4).

Each CAM cell (802(1,1) to 802(1,4)) is shown to include a corresponding data value register (804(1,1) to 804(1,4)) and a mask value register (806(1,1) to 806(1,4)). In the particular arrangement of FIG. 8, each data value register (804(1,1) to 804(1,4)) stores a one bit data value. The mask value registers (806(1,1) to 806(1,4)) each store a one bit mask value corresponding to the data value. The stored mask value determines whether or not the corresponding data value will be compared with a comparand value. For example, referring back to FIG. 6A, in the event the storage register 804(1,1) stored the value D3, the mask register 806(1,1) would store the logic 0 mask value. (The mask value is the inverse of the prefix value). The remaining data value registers 804(1,2) to 804(1,4) would store the data values E3, F3 and G3, respectively, while the remaining mask value registers 806(1,2) to 806(1,4) would all store a logic "0."

Each CAM cell (802(1,1) to 802(1,4)) is shown to further include a data compare circuit (808(1,1) to 808(1,4)) and a mask compare circuit (810(1,1) to 810(1,4)). The data compare circuits (808(1,1) to 808(1,4)) enable the data output value from their respective data value registers (804(1,1) to 804(1,4)) to be compared with an applied data comparand value. In a similar fashion, and unlike a conventional ternary CAM, the mask compare circuits (810(1,1) to 810(1,4)) enable the mask output from their respective mask value registers (806(1,1) to 806(1,4)) to be compared with an applied mask comparand value. The inclusion of the mask compare circuit (810(1,1) to 810(1,4)) enables a mask compare function that is not possible with a conventional ternary CAM. This mask compare function enables the rapid "ordered insert" and "ordered delete" functions of the preferred embodiment by providing a mechanism for finding the location of a prefix that matches the prefix of a new look-up value (in the case of an ordered insert function) or the location of a value that is to be deleted (in the case of an ordered delete function).

The output of each data compare circuit (808(1,1) to 808(1,4)) is coupled to a corresponding mask circuit (812(1,1) to 812(1,4)) within each CAM cell (802(1,1) to 802(1,4)). Each mask circuit (812(1,1) to 812(1,4)) is controlled by the mask value stored within its corresponding mask register (806(1,1) to 806(1,4)). When a stored mask value is a logic "0," the mask circuit (812(1,1) to 812(1,4)) is enabled, allowing the comparison between the stored data value and an applied comparand value to be coupled to a match line common to the row of CAM cells. The match lines for the rows set forth in FIG. 8 are designated by the reference characters 814-1 to 814-4, and labeled as MATCH1–MATCH4.

The mask function of the CAM cells (802(1,1) to 802(1,4)) of FIG. 9 will now be described. If it assumed that data value register 804(1,1) stores a data value of "1" and an applied comparand value is also "1," a match indication will be provided by the output of data compare circuit 808(1,1). In the event the mask value stored within mask value register 806(1,1) is a logic 0, the mask circuit 812(1,1) will allow the match indication to be coupled to the match line 814-1. Conversely, in the event the mask value stored within mask value register 806(1,1) is a logic 1, the mask circuit 812(1,1) will prevent the match indication from being coupled to match line 814-1. This arrangement allows for longest prefix matching within the preferred embodiment ternary CAM by allowing non-prefix bits to be masked by a mask circuits during a data value match operation.

As noted above, one way in which the preferred embodiment ternary CAM differs from conventional ternary CAMs, is that each CAM cell (802(1,1) to 802(1,4)) includes a mask compare circuit (810(1,1) to 810(1,4)). As shown in FIG. 8, each mask compare circuit (810(1,1) to 810(1,4)) has an output coupled to the match line of its row (e.g., mask compare circuit 810(1,1) has an output coupled to the match line 814-1). This allows a mask comparison result to be provided in a match line. In this manner, match lines can be used to indicate the location of a matching prefix value, The novel ternary CAM of the preferred embodiment further differs from a conventional ternary CAM in that the data value registers of one row are interconnected to the data value registers of adjacent rows, enabling the data values from adjacent rows to be loaded into one another. In the particular arrangement of FIG. 8, each data value register includes an upper data value input, shown as "UD" and a lower value input, shown as "LD." The UD input of each data value register is coupled to the data value register of the row above it (the "previous row," or lower numbered adjacent row in the CAM order). Similarly, the LD input of each data value register is coupled to the data value register of the row below it (the "subsequent row," or higher numbered adjacent row in the CAM order). This is represented in the particular arrangement of FIG. 8, where the output of data value register 802(1,2) is coupled to the LD input of data register 802(1,1) and to the UD input of data register 802(1,3). It is this general arrangement that allows global "shift-up" and "shift down" functions within the preferred embodiment ternary CAM.

The mask value registers (806(1,1) to 806(1,4)) of the preferred embodiment CAM have the same general arrangement as the data value registers, with the mask value register of one row being interconnected to the mask value registers of adjacent rows. In the particular embodiment of FIG. 8, each mask value register (806(1,1) to 806(1,4)) includes an upper data value input "UD" and a lower data value input "LD." In the same general fashion as the data value registers (804(1,1) to 804(1,4)), each mask value has an UD input coupled to the mask value register of the row above it and an LD input coupled to the mask value register of the row below it. This arrangement allows for the global shift of mask data values involved in the shift up and shift down functions.

The schematic diagram of FIG. 8 can be considered "simplified" in that the figure omits word lines, bit line pairs, and control signals necessary to control the data value registers (804(1,1) to 804(1,4)) and mask value registers (806(1,1) to 806(1,4)). This done to avoid unduly cluttering the view.

Figure 9:
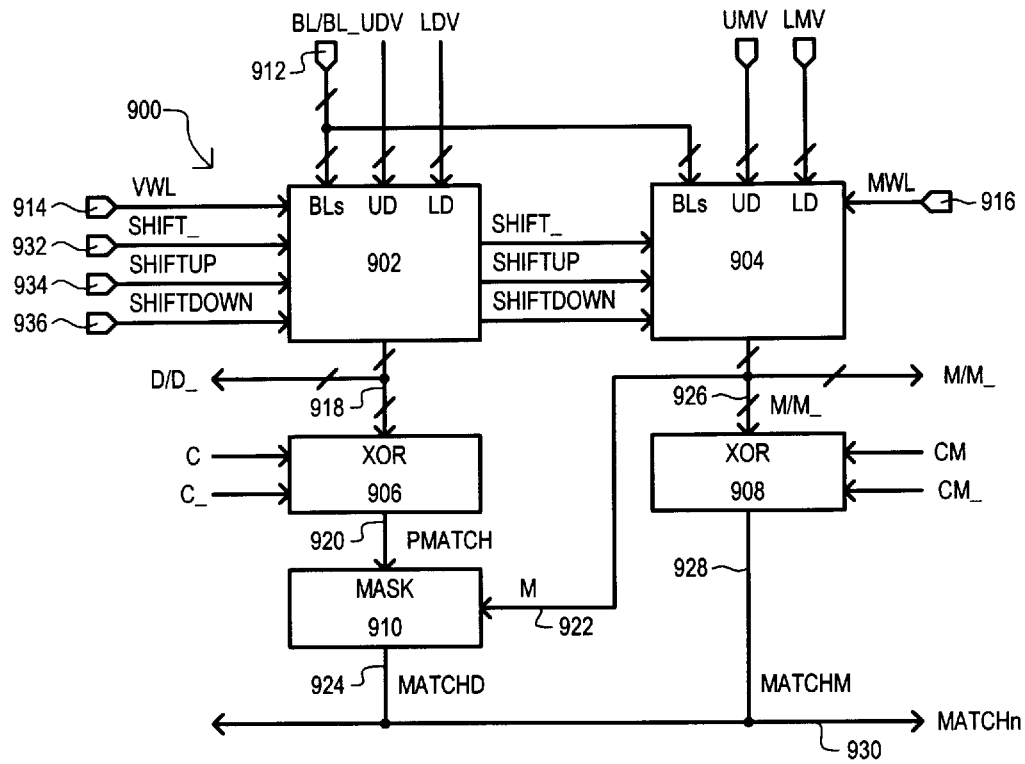
FIG. 9 is a detailed block schematic diagram illustrating a CAM cell according to the preferred embodiment.

To better understand the various lines and signals that were omitted from FIG. 8, a detailed block schematic diagram is set forth in FIG. 9. FIG. 9 illustrates a single CAM cell according to the preferred embodiment. The single CAM cell is designated by the general reference character 900 and is shown to include a data value register 902, a mask value register 904, data compare circuit 906, mask compare circuit 908, and a mask circuit 910. The data value register 902 is shown to receive an upper data value UDV at an upper data input UD and a lower data value LDV at a lower data input LD. Similarly, the mask value register 904 receives an upper mask value UMV at an upper data input UD and a lower mask value at a lower data input LD. As previously described in conjunction with FIG. 8, the UDV and UMV signals are provided from an upper row and the LDV and LMV signals are provided from a lower row. The CAM cell 900 can thus be considered to include four inputs. A first input receives the UDV value, a second input receives the LDV value, a third input receives the UMV value, and the fourth input receives the LMV value.

In the preferred embodiment CAM cell 900, the data value registers and mask value registers of the same column are commonly coupled to a pair of complementary bit lines. Thus, as shown in FIG. 9, a bit line pair (BL/BL_) 912 is coupled to both the data value register 902 and the mask value register 904. In addition, the data value registers of the same row are commonly coupled to a value word line. This is represented in FIG. 9 by the data value register 902 being coupled to a value word line (VWL) 914. In a similar fashion, the mask value registers of the same row are commonly coupled to a mask word line. Accordingly, the mask value register 904 is shown to be coupled to a mask word line (MWL) 916.

The combination of the bit line pair 912 and value word line 914 provides access to the data value register 902. In a data read operation, the value word line 914 is activated (driven high, in the preferred embodiment), and the data value stored within the data value register 902 will be placed on the complementary bit lines 912. In a data write operation, a data value is driven on the complementary bit lines 912, and the value word line 914 is then activated, resulting in the data value being stored within the data value register 902. The bit line pair 912 and mask word line 916 operate in a similar fashion, providing access to the mask value register 904. In a mask read operation, mask data stored in the mask value register 904 is placed on the bit line pair 912. In a mask write operation, mask data is driven on the bit line pair 912, and thereby written into the mask value register 904.

The data value stored within data value register 902 is provided as a data output 918 to the data compare circuit 906. In the preferred embodiment CAM cell 900, the data value is provided in complementary form, and is shown in FIG. 9 as D\D__. The data compare circuit 906 of the particular arrangement of FIG. 9 is shown to be an exclusive OR (XOR) circuit. In addition to the data values (D\D__), the data compare circuit 906 further receives complementary data comparand values C/C__. In the preferred embodiment, data comparand values (C/C__) are commonly applied to the CAM cells of the same column. This is illustrated in FIG. 9 by the data comparand values (C/C__), which are shown to be applied to the data compare circuit 906. In the event the data value (D/D__) matches the data comparand value (C/C__) the data compare circuit 906 provides an active pre-match signal PMATCH at a data compare output 920. If the data value (D/D__) differs from the data comparand value (C/C__), the PMATCH signal is inactive.

The data compare output 920 is provided as an input to the mask circuit 910. The mask circuit 910 further receives the mask value (M) as a control input 922. The mask circuit 910 selectively couples the data compare output 920 to a data match output 924. The data match output 924 provides a data match output MATCHD that will depend upon the mask value control input. When the M value is inactive (low in the particular arrangement of FIG. 9), the data compare output 920 will be coupled to the data match output 924. When the M value is active (high), the data compare output 920 will be isolated from the data match output 924.

The data compare circuit 906 may take the form of the data compare circuit 400 set forth in FIG. 4, and the mask circuit 910 may take the form of the mask circuit 500 set forth in FIG. 5. In such an arrangement, assuming the mask value is inactive, an active PMATCH signal will result in the data match output 924 being isolated from a low (ground) power supply voltage. This enables the data match output 924 to be maintained at a high, precharged level. Conversely, assuming the mask value is inactive and the PMATCH signal is active, the data match output 924 will be driven to the low power supply voltage by way of the mask circuit 910, thereby indicating a no match condition.

The mask value stored within mask value register 904 is provided as a mask output 926. In the preferred embodiment CAM cell 900, the mask value is provided in complementary form, and is shown in FIG. 9 as M/M__. The non-inverted mask value (M) is provided to the mask circuit 910 as previously described. The mask value is provided in complementary form to the mask compare circuit 908. The mask compare circuit 906 of the particular arrangement of FIG. 9, like the data compare circuit 906, is shown to be an XOR circuit. The mask compare circuit 908 further receives complementary mask comparand values CM/CM__, and operates in the same general fashion as the data compare circuit 906, providing an active or inactive mask match indication MATCHM at a mask match output 928 according to the comparison between the M/M__ and CM/CM__ values. The mask compare circuit 908 can take the form of the compare circuit 400 set forth in FIG. 4. In the preferred embodiment, the mask comparand values (M/M__) are commonly applied to the CAM cells of the same column. This is illustrated in FIG. 9 by the mask comparand values (CM/CM__) which are shown as being applied to the mask compare circuit 908.

As shown in FIG. 9, the data match output 924 and mask match output 928 are both coupled to a match line 930. The match line 930 is commonly coupled to the data match outputs and mask match outputs of the same row. It is this arrangement that allows for a conventional match operation (a comparison of a comparand data word to the stored data word—with variable prefix capabilities). Furthermore, unlike a conventional ternary CAM, the arrangement also allows for a prefix (or mask) match operation (a comparison of an input prefix value to the stored prefix values). Thus, the match signal (MATCHn) provided by the match line 930 can indicate either a data word match/no match or a prefix match/no match. Such a novel capability is absent from the prior art.

FIG. 9 also illustrates the control signals utilized by the preferred embodiment CAM cell 900 for initiating the shift up and shift down functions. As shown in FIG. 9, the data value register 902 is coupled to a shift enable line 932 that carries a SHIFT__ signal, a shift up line 934 that carries a SHIFTUP signal, and a shift down line 936 that carries a SHIFTDOWN signal. The data value register 902 executes shift operations according to the values of the SHIFT__, SHIFTUP, and SHIFTDOWN signals. When the SHIFT__ signal is inactive (high), shift operations cannot take place, and the UDV and LDV values are prevented from being loaded into the data value register 902. However, when the SHIFT__ signal is active (low), shift operations will take place, and will depend upon the SHIFTUP and SHIFTDOWN signals. If the SHIFTUP signal is active (high) the LDV value will be coupled to, and stored in the data value register 902. Likewise, if the SHIFTDOWN signal is active (high) the UDV value will be coupled to, and stored in the data value register 902. It is noted that while the SHIFT__ signal is active and a UDV or LDV value is stored within the data value register 902, the data output 918 continues to provide the previously stored data value, enabling the previously stored data value to function as a UDV value for a CAM cell of a subsequent row, or an LDV value for a CAM cell of a previous row. When the SHIFT__signal returns to the inactive state, the newly stored data value (i.e., either the UDV or LDV value) will be provided at the data output 918.

The SHIFT__ SHIFTUP and SHIFTDOWN signals are further coupled to the mask value register 904. The mask value register 904 responds to these shift control signals in the same general fashion as the data value register 902. When the SHIFT__ signal is inactive, shift operations cannot take place. When the SHIFT__ and SHIFTUP signals are active, the LMV value is loaded into the mask storage register 904, while the mask output 926 continues to provide the previous mask value as an output. When the SHIFT__ and SHIFTDOWN signals are active, the UMV value is loaded into the mask storage register 904, while the mask output 926 continues to provide the previous mask value as an output. When the SHIFT__ value returns to the inactive state, the newly stored mask value (UMV or LMV) will be provided at the mask output 926. Thus, the unique functions provided by the data value register 902 and a mask value register 904 enable the parallel shift of data values and corresponding mask (prefix) values from the CAM cells of one row, to the CAM cells of an adjacent row.

Figure 10:
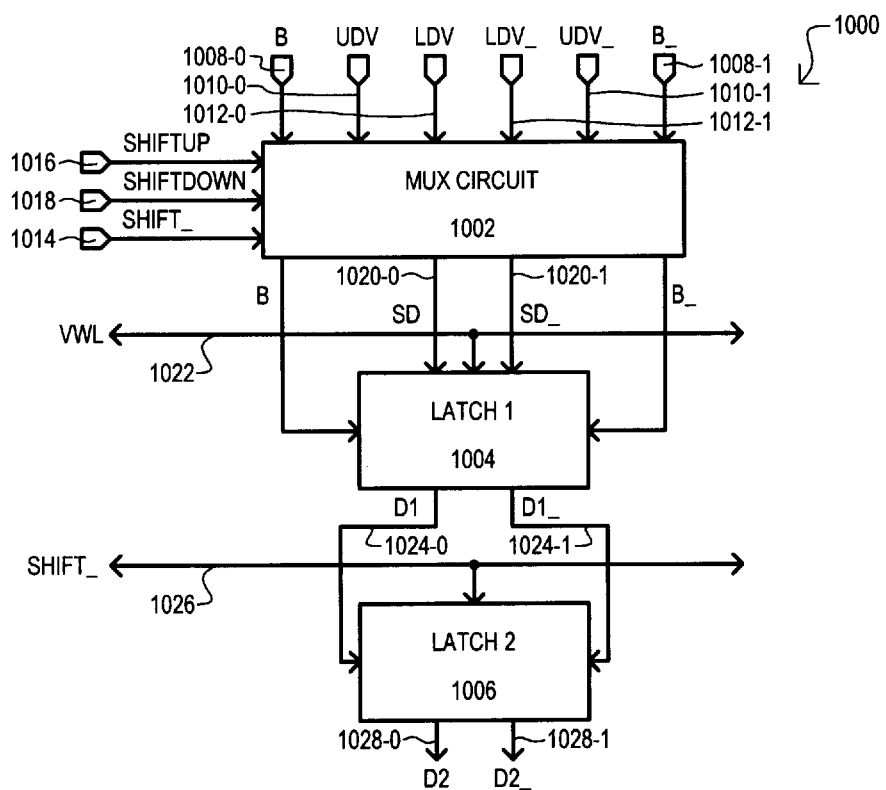
FIG. 10 is a block schematic diagram illustrating an enhanced register according to the preferred embodiment.

Having described the arrangement of a CAM cell according to the preferred embodiment, an enhanced register that may be used as the data value register or mask value register will now be described. The enhanced register is set forth in FIG. 10 and designated by the general reference character 1000. The enhanced register 1000 is "enhanced" in that it performs more than a simple data storage function. As shown in FIG. 10, the enhanced register 1000 is shown to include a multiplexer (MUX) circuit 1002, a first latch 1004 and a second latch 1006.

The MUX circuit 1002 receives three signal line pairs as inputs. The signal line pairs include a bit line pair (1008-0/1008-1) labeled B/B__, an upper value line pair (1010-0/1010-1) labeled UDV/UDV__ and a lower value line pair (1012-0/1012-1) labeled LDV/LDV__. Each signal line pair can carry complementary signal values. The MUX circuit 1002 is further shown to receive control signals on three control lines. The three control lines include a shift enable line 1014 (labeled SHIFT__, a first shift direction line 1016 (labeled SHIFTUP), and a second shift direction line 1018 (labeled SHIFTDOWN). The MUX circuit 1002 provides the complementary bit line pair (B and B__) as an output, and further includes a complementary shift data output (SD and SD__) on shift data nodes 1020-0/1020-1.

When the SHIFT__ signal is inactive (high) the multiplexing function of the MUX circuit 1002 is disabled. This isolates the upper and lower data value lines (1010-0/1010-1 and 1012-0/1012-1) from the shift data nodes (1020-0/1020-1) and allows the first latch 1004 to be accessed in a conventional fashion. Namely, when a value word line 1022 is activated, access is provided to the first latch 1004 by way of the bit line pair (B and B__). When the SHIFT__ signal is active (low), the multiplexing function of the MUX circuit 1002 is enabled. In the event the SHIFTUP signal is active (high), the lower data value lines (1012-0/1012-1) are coupled to the shift data nodes (1020-0/1020-1), resulting in a lower data value being stored within the first latch 1004. In the event the SHIFTDOWN signal is active (high), the upper data value lines (1010-0/1010-1) are coupled to the shift data nodes (1020-0/1020-1), resulting in an upper data value being stored within the first latch 1004.

The MUX circuit 1002 can thus be considered an input circuit for the enhanced register 1000, selectively providing an input value (UDV/UDV__ or LDV/LDV__ for storage within the enhanced register 1000.

The data value stored within the first latch 1004 is provided, in complementary form, on a pair of first latch output nodes (1024-0/1024-1). The first latch output nodes (1024-0/1024-1) are provided as inputs to the second latch 1006. The first data values (D1/D1__) from the first latch 1004 are selectively stored within the second latch 1006 according to a second latch control line 1026. The second latch control line 1026 functions in a similar fashion to a word line. When it is active (high), the D1/D1__ values are stored in the second latch 1006. When it is inactive (low), the D1/D1__ values are isolated from the second latch 1006. It is shown in FIG. 10 that the second latch control line 1026 is driven by the SHIFT__signal. The data value stored in the second latch 1006 is provided, in complementary form, on second latch output nodes 1028-0/1028-1.

Because the first latch 1004 stores an input value received from the multiplexer circuit 1002, it can be conceptualized as an input latch. Along these same lines, because the second latch 1006 provides the output data value for the enhanced register 1000, it can be conceptualized as an output latch.

Having described the arrangement of an enhanced register according to the preferred embodiment, the operation of the enhanced register 1000 will be described.

In a conventional read or write operation, the SHIFT__ signal is high, resulting in the multiplexing function of MUX circuit 1002 being disabled, and the first and second latches (1004 and 1006) being coupled to one another, and storing the same data value. Thus, in a read operation, once the value word line 1022 is driven high, the first latch 1004 will place the stored data value on the complementary bit lines (1008-0/1008-1). In a write operation, an input data value will be driven on the bit lines (1008-0/1008-1), and once the value word line 1022 is driven high, the input data value will be written into the first latch 1004. Because the second latch 1006 is coupled to the first latch 1004, the first latch 1004 will force the second latch 1006 to store the input data value.

A shift up function is initiated by the SHIFT__ signal being activated (driven low), while the SHIFTUP signal is high. With the SHIFT__ signal low, the second latch 1006 is isolated from the first latch 1004. Thus, as lower data values are coupled into the first latch 1004, the first latch output nodes 1024-0/1024-1 will be driven according to the newly input data (from the adjacent lower row). However, the second latch output nodes 1028-0/1028-1 will continue to output the previously stored data value. This previously stored value will be provided to the MUX circuit of a CAM cell in the previous row. The shift up function concludes with the SHIFT__ signal returning high. This results in the second latch 1006 being coupled to the first latch 1004 and storing the data value that was just loaded into the first latch 1002.

A shift down function works in the same general fashion. The SHIFT__ and SHIFTDOWN signals are activated, resulting in an upper data value being stored in the first latch 1004, while the second latch 1006 continues to output the previously stored value. When the SHIFT__ signal returns high, the new value in the first latch 1004 is stored in the second latch 1006.

The first and second latches (1004 and 1006) can take the form of the register circuit 300 set forth in FIG. 3. When utilized as the first latch 1004, the word line (WL) of the register 300 would correspond to the value word line 1022. The shift data nodes (1020-0/1020-1) and first latch output nodes (1024-0/1024-1) would both correspond to the data nodes (D and /D). The bit line inputs (B and B__) to the first latch 1004 would correspond to the bit line pair of FIG. 3 (B and /B). When utilized as the second latch 1006, the word line (WL) of the register 300 would correspond to the second latch control line 1026. The first latch output nodes (1024-0/1024-1) would correspond to the bit line pair of FIG. 3 (B and /B), while the second latch output nodes (1028-0/1028-1) would correspond to the data nodes (D and /D) of FIG. 3.

Figure 11A:
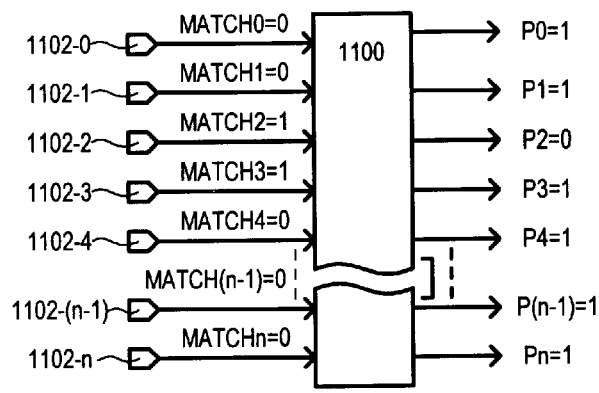
FIGS. 11A, 11B and 11C are block diagrams illustrating the operation of a priority encoder that may be used in the preferred embodiment.
Figure 11B:
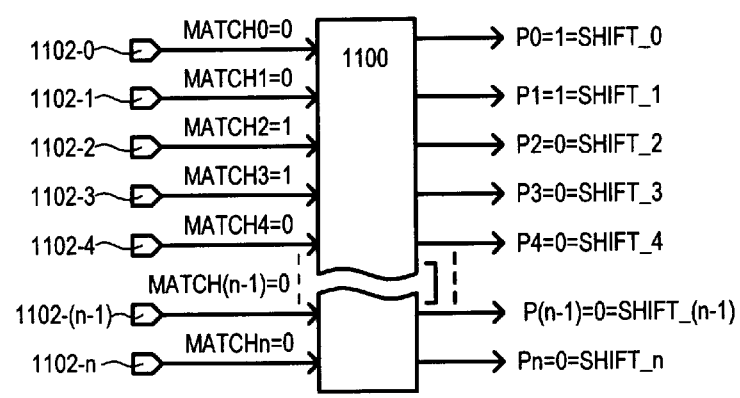
Figure 11C:
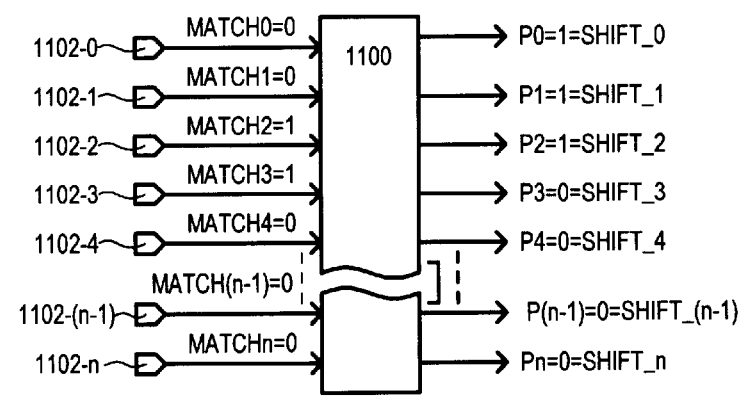

To better understand the operation of a CAM according to the preferred embodiment, the operation of a modified priority encoder that may be used in the preferred embodiment will now be described. Referring now to FIGS. 11A–11C, a priority encoder 1100 is set forth in a block diagram. The priority encoder 1100 receives a match line (1102-0 to 1102-n) corresponding to each row within the CAM cell array. Each match line (1102-0 to 1102-n) provides a corresponding match signal MATCH0–MATCHn. In response to the various MATCH0–MATCHn signals, the priority encoder 1100 provides a series of encoder output signals (P0–Pn), each encoder output signal corresponding to one of the match lines (1102-0 to 1102-n).

FIG. 11A illustrates the operation of the priority encoder 1100 in a conventional search (or match) operation in which a data comparand value is applied to the data values within the CAM. The applied data comparand value results in two matches, with the MATCH2 and MATCH3 signals both being driven high. According to pre-established criteria, the priority encoder 1100 activates a single encoder output signal. In the particular example, the P2 signal is activated, thus indicating that the priority matching value is stored in data location 2.

FIG. 11B illustrates the operation of the priority encoder 1100 in a shift up operation according to the preferred embodiment. Initially a mask (inverse prefix) comparand value is applied to the mask values within the CAM to find those locations that contain the same value. In the particular example of FIG. 11B, the applied mask comparand value results in two matches, with the MATCH2 and MATCH3 signals both being driven high. The priority encoder 1100 activates (drives low) the encoder output signal (P2) corresponding to the lowest numbered location with a match (location 2). In addition, the encoder activates the encoder output signals corresponding to all subsequent (higher numbered) locations. Thus, as shown in FIG. 11B, encoder output signals P2–Pn are all driven low. FIG. 11B further shows how the resulting encoder output signals can be used as shift enable signals for the various CAM array rows.

FIG. 11C illustrates the operation of the priority encoder 1100 in a shift down operation according to the preferred embodiment. Once again, a mask comparand value is applied to the mask values stored within the CAM to find the matching locations. In the particular example of FIG. 11C, the applied mask comparand results in the same two matches (the MATCH2 and MATCH3 signals). Unlike the shift up case, in the shift down case, the priority encoder 1100 activates (drives low) the encoder output signal corresponding to all subsequent (higher numbered) locations only, and not the output signal corresponding to MATCH2. Thus, as shown in FIG. 11C, encoder output signals P3–Pn are all driven low. Like FIG. 11B, FIG. 11C illustrates how the resulting encoder output signals can be used as shift enable signals for the various CAM array rows.

It is understood that while the preferred embodiment has been described with examples that include four-bit data storage words and prefix values, the CAM of the preferred embodiment would include a much larger data width, 64-bits as just one possible example. Accordingly, the particular examples set forth in FIGS. 6A–6C and 7A and 7B should not be construed as limiting the invention thereto.

The preferred embodiment CAM cell 900 has been described as being capable of utilizing the register circuit 300 of FIG. 3, the compare circuit 400 of FIG. 4, and the mask circuit 500 of FIG. 5. These complementary MOS (CMOS) structure are particularly advantageous in terms of reducing power consumption and providing full logic swings in voltage. Such particular circuits should not be construed as limiting the invention, however, as they represent but one particular preferred embodiment implementation.

Advantageously, the time required for the preferred embodiment to execute a shift up or shift down function should only exceed a conventional access operation by one or two clock cycles. This is decidedly faster than conventional software approaches to reordering values within a ternary CAM. Accordingly, the preferred embodiment approach should address a valuable an important need in router look-up operations.

Finally, it is noted that while the preferred embodiments set forth herein have been described in detail, it should be understood that the present invention could be subject various changes, substitutions, and alterations without departing from the spirit and scope of the invention. Accordingly, the present invention is intended to be limited only as defined by the appended claims.

What is claimed is:

1. In a content addressable memory (CAM) device that includes an array of CAM cells, a content addressable memory cell, comprising:

a first enhanced register that stores at least one first data value, the first enhanced register being coupled to at least one bit line and including a first data input coupled to a CAM cell of a first adjacent row, the first enhanced register providing the first data value at a first register output;

a second enhanced register that stores at least one second data value, the second enhanced register including a first data input coupled to the CAM cell of the first adjacent row; and a first compare circuit having a first compare data input coupled to the first register output and a first comparand input that receives a first comparand value, the compare circuit comparing the value at the first compare data input to the value at the first comparand input and generating a match indication when the values are the same.

2. The CAM cell of claim 1, wherein:

the second enhanced storage register is coupled to the at least one bit line.

3. The CAM cell of claim 1, wherein:

the first register output is coupled to a match line, the match line being commonly coupled to the CAM cells within the same row.

4. The CAM cell of claim 3, further including:

the second enhanced register providing the second data value at a second register output; and a second compare circuit having a second compare data input coupled to the second register output and a second comparand input that receives a second comparand value, the second compare circuit comparing the value at the second compare data input to the value at the second comparand input and generating a match indication when the values are the same.

5. The CAM cell of claim 3, further including:

a mask circuit disposed between the first register output and the match line, the mask circuit being enabled and disabled according to the second data value stored within the second enhanced register, the mask circuit coupling the first register output to the match line when enabled, and providing a high impedance path between the first register output and the match line.

6. The CAM cell of claim 1, wherein:

the first enhanced register includes
a first latch circuit that stores an input data value, and
a second latch circuit coupled to the first latch circuit, the second latch circuit being enabled and disabled by a second latch control signal, the second latch circuit being coupled to the first latch circuit when enabled, and being isolated from the first latch circuit when disabled.

7. The CAM cell of claim 6, wherein:

the first latch circuit is enabled and disabled by a word line signal, the first latch being coupled to the at least one bit line when enabled and being isolated from the at least one bit line when disabled.

8. The CAM cell of claim 6, wherein:

the second enhanced register includes
a third latch circuit that stores an input data value, and
a fourth latch circuit coupled to the third latch circuit, the fourth latch circuit being enabled and disabled by the second latch control signal, the fourth latch circuit being coupled to the third latch circuit when enabled, and being isolated from the third latch circuit when disabled.

9. A content addressable memory (CAM) that allows for the parallel shifting of data between adjacent rows, comprising:

a plurality of CAM cells arranged into rows and columns, substantially all of the rows of CAM cells each being situated between a previous row of CAM cells and a subsequent row of CAM cells;

a plurality of shift lines that carry shift signals, at least one shift line associated with each row of CAM cells;

each CAM cell being situated within a particular column of CAM cells and including
a data storage latch,
a first input coupled to the data storage latch of a CAM cell in the previous row that is situated within the particular column,
a second input coupled to the data storage latch of a CAM cell in the subsequent row that is situated within the particular column, and
a first multiplexer (MUX) circuit that is controlled by at least one shift signal, the first multiplexer circuit coupling the first input to the data storage latch or the second input to the data storage latch, according to the at least one shift signal.

10. The CAM of claim 9, wherein:

the plurality of shift lines include a shift up line that carries a shift up signal and a shift down line that carries a shift down signal; and the first multiplexer (MUX) circuit couples the first input to the data storage latch when the shift down signal is active, and couples the second input to the data storage latch when the shift up signal is active.

11. The CAM of claim 9, wherein:

the plurality of shift lines include a shift enable line that carries a shift enable signal; and the first multiplexer (MUX) circuit isolates the first input and second input from the data storage latch when the shift enable signal is inactive.

12. The CAM of claim 9, wherein:

the CAM cells of the same column are commonly coupled to at least one bit line; and the CAM cells of the same row are commonly coupled to a word line, each word line, when activated, coupling the data storage latch within each CAM cell of its row to its corresponding at least one bit line.

13. The CAM of claim 9, further including:

at least one first comparand line associated with each column of CAM cells;

a match line associated with each row of CAM cells; and each CAM cell further including a first compare circuit having a first compare input coupled to the data storage latch and a second compare input coupled to the at least one first comparand line associated with the CAM cell column, the first compare circuit providing a first match indication on its associated match line that varies according to differences between values at the first compare input and second compare input.

14. The CAM of claim 13, further including:

at least one second comparand line associated with each column of CAM cells; and each CAM cell further including
a mask data storage latch,
a third input coupled to the mask data storage latch of a CAM cell in the previous row that is situated within the particular column,
a fourth input coupled to the mask data storage latch of a CAM cell in the subsequent row that is situated within the particular column,
a second multiplexer (MUX) circuit that is controlled by the at least one shift signal, the second multiplexer circuit coupling the third input to the mask data storage latch or the fourth input to the mask data storage latch, according to the at least one shift signal, and
a second compare circuit having a third compare input coupled to the mask data storage latch and a fourth compare input coupled to the second comparand line associated with the CAM cell column, the second compare circuit providing a second match indication on its associated match line that varies according to differences between values at the third compare input and fourth compare input.

15. The CAM of claim 13, wherein:

each CAM cell further includes a mask circuit having a mask input that receives the first match indication from the first compare circuit and a control input coupled to the mask data storage latch, the mask input providing a low impedance path between the match indication and the associated match line when the match data storage latch stores a predetermined logic value.

16. A ternary content addressable memory (CAM), comprising:

a plurality of CAM locations, each of which stores a multi-bit data value and a corresponding multi-bit mask value, each CAM location including a row of CAM cells;

data value shifting means for shifting the data values of a selected group of CAM locations to adjacent CAM locations in a generally simultaneous fashion; and mask value shifting means for shifting mask values of a selected group of CAM locations to adjacent CAM locations in a generally simultaneous fashion.

17. The ternary CAM of claim 16, wherein:

each CAM cell stores a data value bit and a corresponding mask value bit.

18. The ternary CAM of claim 16, wherein:

the shifting means includes an input circuit within each CAM cell, the input circuits of each row of CAM cells being commonly coupled to a shift line and receiving the data value and mask value from an adjacent row of CAM cells, the input circuits of a row of CAM cells loading the data value and mask value from the adjacent row when the shift line has a predetermined logic value.

19. The ternary CAM of claim 16, wherein:

the plurality of CAM locations are arranged in a particular order; and the shifting means includes a multiplexer circuit within each CAM cell, the multiplexer circuits of each row of CAM cells being commonly controlled by at least one shift direction signal and receiving a multi-bit upper data value and a multi-bit upper mask value from a previous row of CAM cells in the CAM location order, and a multi-bit lower data value and a multi-bit lower mask value from a subsequent row of CAM cells in the CAM location order, the multiplexer circuits of a row of CAM cells loading the upper data value and upper mask value when the at least one shift direction signal provides a shift down indication, and loading the lower data value and lower mask value when the at least one shift direction signal provides a shift up indication.

20. The ternary CAM of claim 16, further including:

the shifting means including an input latch and an output latch within each CAM cell, the output latches within each row of CAM cells being commonly enabled and disabled by at least one shift control signal associated with the row of CAM cells; and the input latches and output latches of a row of CAM cells being coupled to one another when the output latches of the row of CAM cells are enabled, and being isolated from one another when the output latches of the row of CAM cells are disabled.

* * * * *